(12) United States Patent
Ingle et al.

(10) Patent No.: US 9,818,968 B2
(45) Date of Patent: Nov. 14, 2017

(54) OPTOELECTRONIC COMPONENT, OPTOELECTRONIC COMPONENT DEVICE AND METHOD FOR PRODUCING AN OPTOELECTRONIC COMPONENT

(71) Applicant: OSRAM OLED GmbH, Regensburg (DE)

(72) Inventors: Andrew Ingle, Allershausen (DE); Kilian Regau, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 14/917,028

(22) PCT Filed: Sep. 3, 2014

(86) PCT No.: PCT/EP2014/068725
§ 371 (c)(1),
(2) Date: Mar. 7, 2016

(87) PCT Pub. No.: WO2015/032810
PCT Pub. Date: Mar. 12, 2015

(65) Prior Publication Data
US 2016/0211476 A1    Jul. 21, 2016

(30) Foreign Application Priority Data

Sep. 9, 2013  (DE) .................. 10 2013 109 814

(51) Int. Cl.
*H01L 29/08*    (2006.01)
*H01L 51/52*    (2006.01)
(Continued)

(52) U.S. Cl.
CPC .............. *H01L 51/52* (2013.01); *H01L 51/44* (2013.01); *H01L 51/56* (2013.01); *H05B 33/0848* (2013.01); *H01L 2251/5361* (2013.01)

(58) Field of Classification Search
CPC . H01L 2251/5361; H01L 51/44; H01L 51/52; H01L 51/56; H05B 33/0848
(Continued)

(56) References Cited

U.S. PATENT DOCUMENTS

| | | | |
|---|---|---|---|
| 7,375,473 B2* | 5/2008 | Cok | H05B 33/0896 315/308 |
| 2007/0029939 A1* | 2/2007 | Burkum | G09F 13/22 315/86 |

(Continued)

FOREIGN PATENT DOCUMENTS

| | | |
|---|---|---|
| DE | 102011084437 A1 | 4/2013 |
| EP | 1821577 A1 | 8/2007 |

(Continued)

OTHER PUBLICATIONS

International Search Report based on Application No. PCT/EP2014/068725 (3 Pages) dated Jan. 23, 2015 (Reference Purpose Only).
(Continued)

*Primary Examiner* — Mohammed Shamsuzzaman
(74) *Attorney, Agent, or Firm* — Viering, Jentschura & Partner mbB

(57) ABSTRACT

Various embodiments may relate to an optoelectronic component. The optoelectronic component may include a planar optically active structure and an electric circuit structure. The planar optically active structure is designed to receive and/or provide electromagnetic radiation. The electric circuit structure is designed such that it provides an output value. The output value is dependent on at least one operational parameter of the optically active structure.

15 Claims, 7 Drawing Sheets

(51) Int. Cl.
   *H05B 33/08* (2006.01)
   *H01L 51/44* (2006.01)
   *H01L 51/56* (2006.01)

(58) Field of Classification Search
   USPC ............... 257/40; 438/26; 315/308, 294, 86,
   315/169.3; 345/77
   See application file for complete search history.

(56) References Cited

U.S. PATENT DOCUMENTS

| | | |
|---|---|---|
| 2007/0194719 A1 | 8/2007 | Heuser et al. |
| 2011/0187285 A1* | 8/2011 | Hente ................ H05B 33/0896 315/294 |
| 2014/0264311 A1 | 9/2014 | Lang et al. |
| 2015/0270509 A1* | 9/2015 | Ingle ................... H01L 51/5253 438/26 |

FOREIGN PATENT DOCUMENTS

| | | |
|---|---|---|
| JP | 2007173088 A | 7/2007 |
| WO | 2010029459 A1 | 3/2010 |

OTHER PUBLICATIONS

German Search Report based on Application No. 10 2013 109 814.2 (5 Pages) dated Oct. 15, 2013 (Reference Purpose Only).

* cited by examiner

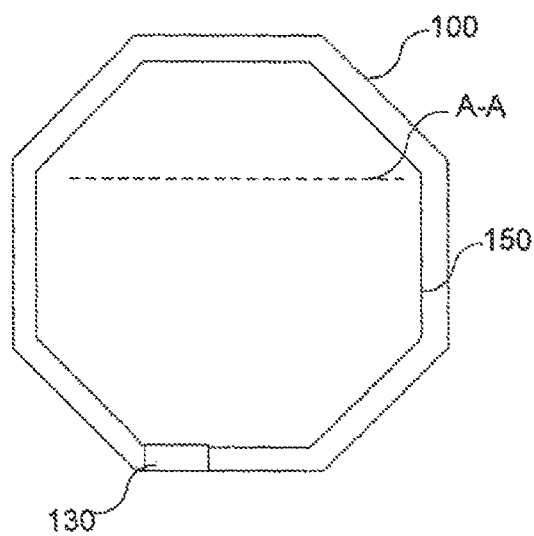
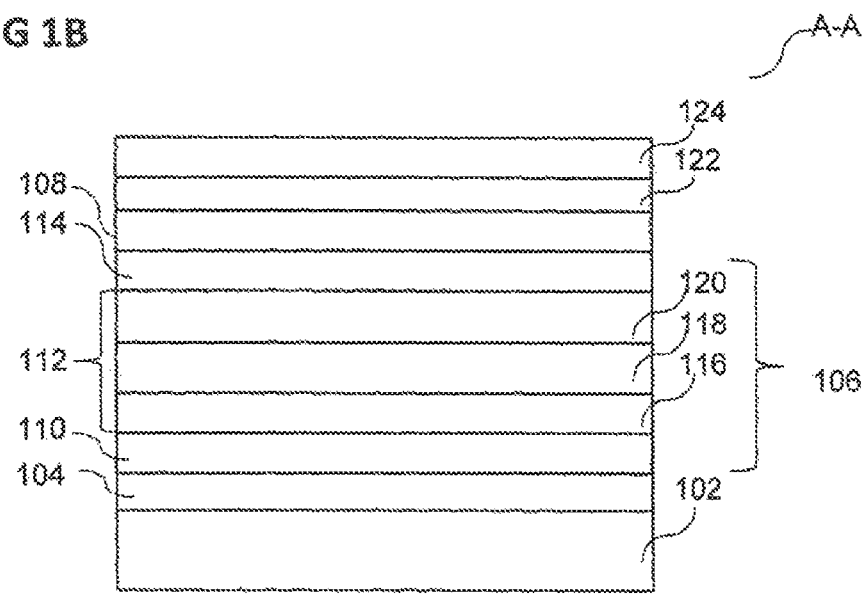

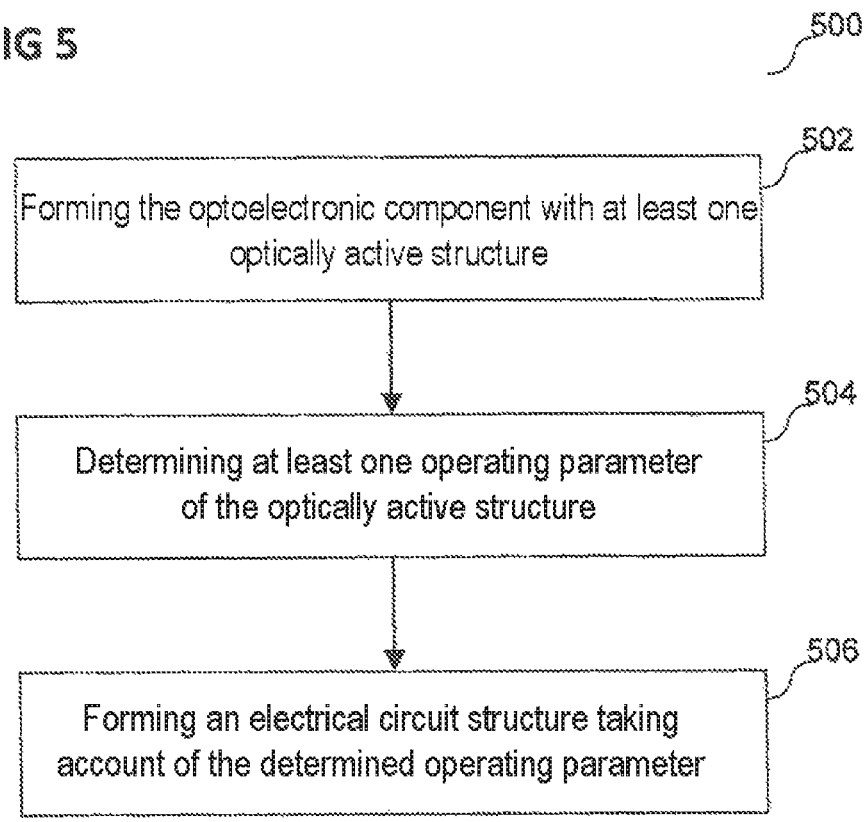

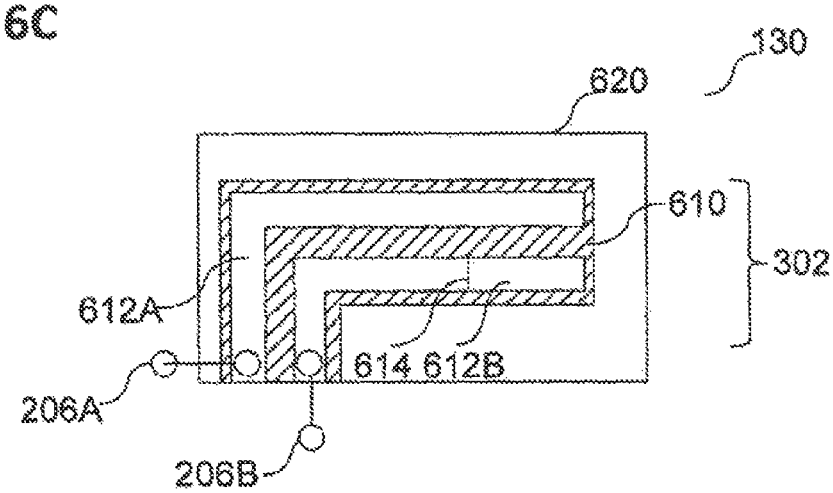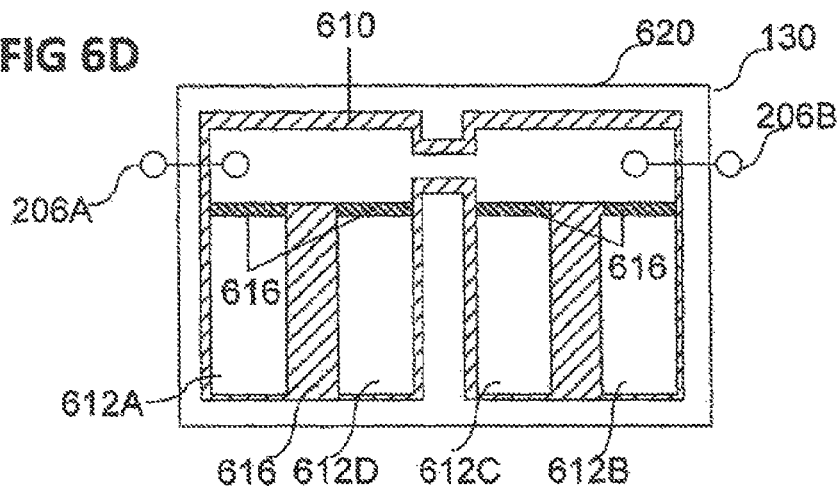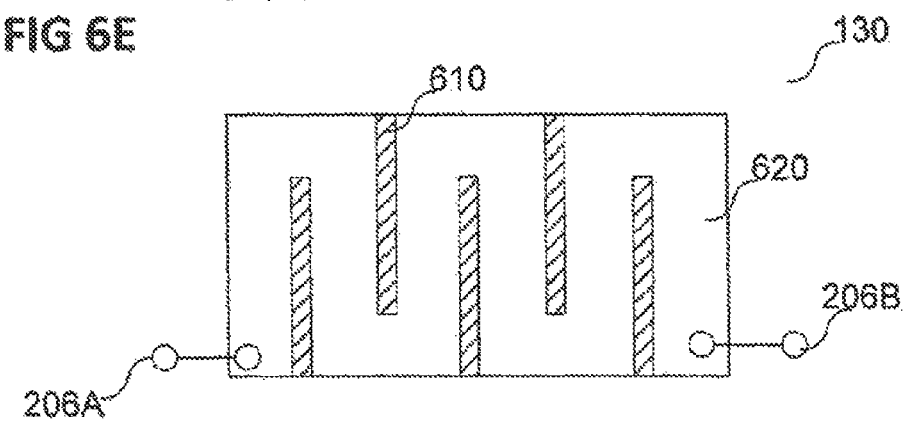

OPTOELECTRONIC COMPONENT, OPTOELECTRONIC COMPONENT DEVICE AND METHOD FOR PRODUCING AN OPTOELECTRONIC COMPONENT

RELATED APPLICATIONS

The present application is a national stage entry according to 35 U.S.C. §371 of PCT application No.: PCT/EP2014/068725 filed on Sep. 3, 2014 which claims priority from German application No.: 10 2013 109 814.2 filed on Sep. 9, 2013, and is incorporated herein by reference in its entirety.

TECHNICAL FIELD

In various embodiments, an optoelectronic component, an optoelectronic component device and a method for producing an optoelectronic component are provided.

BACKGROUND

Optoelectronic components on an organic basis, for example an organic light emitting diode (OLED), are being increasingly widely used in general lighting, for example as a surface light source. A conventional organic optoelectronic component, for example an OLED, may include an anode and a cathode with an organic functional layer system therebetween. The organic functional layer system includes one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

In a conventional electronic ballast unit for a light emitting diode, two additional contacts are provided on the printed circuit board of the electronic ballast unit alongside the contacts for energizing the light emitting diode, to which additional contacts the electrical resistor calculated for a determined universal ballast unit is already connected during the LED and electronic system placement. Consequently, for the operation of the light emitting diode, the user need only connect the latter to the ballast unit. The electronic ballast unit measures the electrical resistance and, in accordance with a conversion formula, provides a current having a correlated current intensity at the output for the light emitting diode of the electronic ballast unit.

Organic light emitting diodes can be formed in a multiplicity of configurations, for example with a wide variety of technologies, materials, sizes and shapes. This results in a multiplicity of different rated currents for the multiplicity of organic light emitting diodes. Each configuration from the multiplicity of organic light emitting diodes can be operated with a different rated current. On account of the multiplicity of configurations of organic light emitting diodes, individual configurations can have for example operating currents that are unusual in LED technology, for example an operating current of 123 mA or the like. In order that the rated current is approximately identical in the multiplicity of organic light emitting diodes, electronic ballast units with an adjustable output current intensity or output voltage are required.

The individually adjustable electronic ballast unit of a conventional inorganic light emitting diode is conventionally used for operating an organic light emitting diode. Such an electronic ballast unit provides an electrical current in a wide current intensity range and can permit any arbitrary current intensity value or at least finely gradated current intensity values in this range.

From the viewpoint of users, an organic light emitting diode should be able to be installed in a device or a component as simply as possible and without a deeper level of previous technical knowledge. Furthermore, the integration of the optoelectronic component into a device should not require any special outlay.

In one conventional method, it is necessary for the user of organic light emitting diodes to glean the required rated current intensity of the organic light emitting diode from the data sheet. The user then has to convert the rated current intensity into a resistance value by means of a formula or table. Afterward, the user has to approximate the resistance value to values of conventionally available resistors. Finally, the user has to correctly connect the resistor to the interface of the electronic ballast unit. Many users of organic light emitting diodes would like not to deal, or cannot deal, with this multiplicity of technical decisions or would like not to make the required technical effort, but rather prefer technically simple solutions, for example plug & play.

Even if the user can make these decisions and makes this effort, errors can potentially occur. By way of example, calculations may be erroneous, incorrect resistors may be used, for example incorrect resistors may be supplied or mounted; and/or the resistor may be contacted incorrectly. Incorrect resistance values may result in the organic light emitting diode being operated with an incorrect current. In general, the output current of the ballast unit is not remeasured after the current intensity has been set. As a result, an incorrectly set current may not be identified immediately, as a result of which the organic light emitting diode may be damaged.

SUMMARY

In various embodiments, an optoelectronic component, an optoelectronic component device and a method for producing an optoelectronic component are provided which make it possible to form and operate an organic optoelectronic component that is technically simpler to operate.

In various embodiments, an optoelectronic component is provided, the optoelectronic component including: a planar optically active structure and an electrical circuit structure, wherein the planar optically active structure is formed for taking up and/or providing electromagnetic radiation; and wherein the electrical circuit structure is formed in such a way that it provides an output value, wherein the output value is dependent on at least one operating parameter of the optically active structure.

In one configuration, the planar optically active structure may include a first electrode, a second electrode and an organic functional layer structure, wherein the organic functional layer structure is formed between the first electrode and the second electrode.

In one configuration, the optoelectronic component can be formed as an organic light emitting diode, an organic solar cell and/or an organic photodetector.

In one configuration, the optoelectronic component can be formed as a surface component.

In one configuration, the at least one operating parameter can be dependent on the electrical current intensity and/or current density of the operating current and/or the operating voltage of the optically active structure.

In one configuration, the at least one operating parameter can be dependent on the planar dimensioning of the optically active structure.

In one configuration, the at least one operating parameter can be dependent on the voltage and/or the light color.

Planar optoelectronic components of the same design but having different planar dimensionings should be operated with an identical current density. As a result, an identical aging and lifetime of the optoelectronic components having different planar dimensionings can be formed, for example with an identical brightness impression on account of the constant luminance and/or an identical color locus. On account of the different planar dimensionings, electrical currents having different current intensities are required for providing an identical current density for the different optoelectronic components. Consequently, an operating parameter, for example, the required current intensity, can be dependent on the component-specific planar dimensioning of the optically active structure.

Further operating parameters of an optoelectronic component can be dependent on process-dictated fluctuations, for example of the layer thickness, of a local substance concentration, of the defect density. As a result, two optoelectronic components of one design and having the same planar dimensioning can have different electrical properties, for example different capacitances, electrical resistances, inductances; and/or different optical properties, for example color loci and/or intensity of absorbable and/or emittable electromagnetic radiation.

In one configuration, the electrical circuit structure may include an electrical resistor, wherein the output value is dependent on the electrical resistance value of the electrical resistor.

In one configuration, the electrical circuit structure may include a capacitor, wherein the output value is dependent on the capacitance of the capacitor.

In one configuration, the electrical circuit structure may include an inductance component, wherein the output value is dependent on the inductance of the inductance component.

In one configuration, the electrical circuit structure may include a conductor structure, wherein the conductor structure includes a plurality of electrical lines in such a way that the output value is dependent on the bit pattern of the plurality of electrical lines. In other words: the output value can be dependent on the combination of connections or bridgings and interruptions between the plurality of electrical lines.

In one configuration, the electrical circuit structure may include a first current terminal and at least one second current terminal, wherein the first current terminal is electrically connected to the second current terminal. By way of example, the first current terminal can be formed as a current input and the second current terminal can be formed as a current output.

In one configuration, the electrical circuit structure may include one current input and a plurality of current outputs, wherein the plurality of current outputs are electrically connected to the one current input before the bit pattern is formed. As a result, by way of example, it is possible to realize an electrical circuit structure with a bit pattern with only one current input. The bit pattern can be formed by specific lines of the plurality of lines having interruptions between the current input and their current output. As a result, the current outputs of said lines are not connected to the current input.

In one configuration, the electrical circuit structure can be formed on or above the optically active structure.

In one configuration, the optoelectronic component may furthermore include a cover, wherein the cover is formed on the electrical circuit structure; or wherein the electrical circuit structure is formed on the cover. In the configuration with the cover on the electrical circuit structure, the cover can protect the electrical circuit structure and/or the optically active structure against harmful substances, for example with regard to water and/or oxygen, for example with regard to an oxidation; and/or against mechanical damage, for example scratches.

In one configuration, the electrical circuit structure can be formed alongside the optically active structure, for example in the optically inactive region.

In one configuration, the electrical circuit structure may include a further cover. The further cover can be separated with regard to the cover of the optically active structure. However, the electrical circuit structure and the optically active structure can also have a common cover.

In one configuration, the electrical circuit structure and the planar optically active structure may include at least one common electrode.

In one configuration, the electrical circuit structure can be electrically connected to at least one of the electrodes of the optically active structure.

In one configuration, the electrical circuit structure may include an electrical storage unit, wherein the output value is stored in an electrically readable manner in the electrical storage unit.

In one configuration, the electrical circuit structure may include an interface, wherein the interface includes one or a plurality of terminals, and wherein the interface is designed for electrically reading out the output value.

In one configuration, the interface can be formed for wirelessly reading out the output value.

In various embodiments, a method for producing an optoelectronic component is provided, the method including: forming a planar optically active structure, wherein the planar optically active structure is formed for taking up or providing electromagnetic radiation; determining at least one operating parameter of the optically active structure of the optoelectronic component; and forming an electrical circuit structure taking account of the determined operating parameter in such a way that the output value of the electrical circuit structure is a function of the determined operating parameter.

In one configuration of the method, forming the optically active structure may include forming a first electrode, forming an organic functional layer structure on the first electrode, and forming a second electrode on the organic functional layer structure.

In one configuration of the method, the optoelectronic component can be formed as an organic light emitting diode, an organic solar cell and/or an organic photodetector.

In one configuration of the method, the optoelectronic component can be formed as a surface component.

In one configuration of the method, the at least one operating parameter can be dependent on the electrical current intensity of the operating current of the optically active structure.

In one configuration of the method, the at least one operating parameter can be dependent on the planar dimensioning of the optically active structure.

In one configuration of the method, the at least one operating parameter can be dependent on the voltage and/or the light color.

In one configuration of the method, forming the electrical circuit structure may include forming an electrical resistor, wherein the output value is dependent on the electrical resistance value of the electrical resistor.

In one configuration of the method, forming the electrical circuit structure may include forming a capacitor, wherein the output value is dependent on the capacitance of the capacitor.

In one configuration of the method, forming the electrical circuit structure may include forming an inductance component, wherein the output value is dependent on the inductance of the inductance component.

In one configuration of the method, forming the electrical circuit structure may include forming a conductor structure, wherein the conductor structure is formed with a plurality of electrical lines in such a way that the output value is dependent on the bit pattern of the plurality of electrical lines. In other words: the output value can be dependent on the combination of connections or bridgings and interruptions between the plurality of electrical lines.

In one configuration of the method, forming the electrical circuit structure may include forming a first current terminal and at least one second current terminal, wherein the first current terminal is electrically connected to the second current terminal.

In one configuration of the method, forming the electrical circuit structure may include forming one current input and a plurality of current outputs, wherein the plurality of current outputs are electrically connected to the one current input before the bit pattern is formed. The bit pattern can be formed by—in the case of specific lines of the plurality of lines—interruptions being formed between the current input and their current output. As a result, the current outputs of said lines are not connected to the current input.

In one configuration of the method, the electrical circuit structure can be formed on or above the optically active structure.

In one configuration of the method, forming the optically active structure may furthermore include forming a cover, wherein the cover is formed on the electrical circuit structure; or wherein the electrical circuit structure is formed on the cover.

In one configuration of the method, the electrical circuit structure can be formed alongside the optically active structure.

In one configuration of the method, forming the electrical circuit structure may furthermore include forming a further cover, wherein the further cover is formed above the electrical circuit structure. The further cover can be formed in a separated manner with regard to the cover of the optically active structure. However, the electrical circuit structure and the optically active structure can also be formed with a common cover.

In one configuration of the method, the electrical circuit structure and the planar optically active structure can be formed in such a way that they include at least one common electrode.

In one configuration of the method, the electrical circuit structure can be electrically connected to at least one of the electrodes of the optically active structure.

In one configuration of the method, forming the optically active structure may include forming an electrical circuit preliminary structure.

In one configuration of the method, forming the electrical circuit structure may include structuring the electrical circuit preliminary structure.

In one configuration of the method, forming the electrical circuit structure may include forming an electrically insulating structure and/or forming an electrical bridging structure in the electrical circuit preliminary structure.

In one configuration of the method, forming the electrically insulating structure and/or forming the electrical bridging structure can be formed in such a way that the capacitance of a capacitor; the resistance value of an electrical resistor; the inductance of an inductance component; and/or the bit pattern of a conductor structure are formed with regard to the determined operating parameter.

In one configuration of the method, forming the electrically insulating structure may include a laser ablation.

In one configuration of the method, the electrical circuit preliminary structure can be formed with a first electrically conductive structure and at least one second electrically conductive structure, wherein the first electrically conductive structure is formed in a manner electrically insulated from the second electrically conductive structure.

In one configuration of the method, forming the bridging structure may include forming an electrical connection between the first electrically conductive structure and the second electrically conductive structure.

In one configuration of the method, forming the electrical connection may include applying an electrically conductive substance between the first electrically conductive structure and the second electrically conductive structure.

In one configuration of the method, forming the electrically insulating structure may include forming an electrically insulating substance between the first electrically conductive structure and the second electrically conductive structure.

In one configuration of the method, the electrical circuit preliminary structure can be formed with a third electrically conductive structure.

In one configuration of the method, forming the electrically insulating structure may include removing a part of the third electrically conductive structure in such a way that a fourth electrically conductive structure and a fifth electrically conductive structure are formed.

In one configuration of the method, the fourth electrically conductive structure can be electrically insulated from the fifth electrically conductive structure.

In one configuration of the method, the current path through the electrical circuit structure can be altered by means of removing the part of the third electrically conductive structure.

In one configuration of the method, forming the electrical circuit structure may include forming an electrical storage unit, wherein the electrical storage unit is formed in such a way that the output value is storable in an electrically readable manner in the electrical storage unit.

In one configuration of the method, forming the electrical circuit structure may include forming an interface, wherein the interface is formed with one or a plurality of terminals, and wherein the interface is formed for electrically reading out the output value.

In one configuration of the method, the interface can be formed for wirelessly reading out the output value.

In various embodiments, an optoelectronic component device is provided, the optoelectronic component device including: an optoelectronic component in accordance with configurations presented above; an electronic ballast unit, which is designed for providing an electrical current to the planar optically active structure and/or for taking up an electrical current from the optically active structure; wherein the electronic ballast unit includes a first terminal, a second terminal and a determining device, wherein the determining device is electrically coupled to the first terminal and the second terminal; wherein the planar optically active structure is electrically connected to the first terminal, and the electrical circuit structure is electrically connected to the second terminal; wherein the determining device is designed for determining the output value of the electrical circuit structure and, by means of the determined output value, alters at least one operating parameter of the optically active structure with regard to a predefined operating parameter.

By means of the electrical coupling of the determining device to the first terminal and the second terminal, the determining device can determine the determined output value of the electrical circuit structure. As a result, the determining device can forward to the second terminal the information about an at least one operating parameter to be output, said information being determined by means of the functional relationship.

In one configuration of the optoelectronic component device, the predefined operating parameter can be a current intensity and/or current density and/or voltage specified for the planar optically active structure, for example with regard to the planar dimensioning of the optically active structure.

BRIEF DESCRIPTION OF THE DRAWINGS

In the drawings, like reference characters generally refer to the same parts throughout the different views.

The drawings are not necessarily to scale, emphasis instead generally being placed upon illustrating the principles of the disclosed embodiments. In the following description, various embodiments described with reference to the following drawings, in which:

FIGS. 1A, 1B show schematic views of an optoelectronic component in accordance with various embodiments;

FIG. 5 shows a schematic illustration concerning a method for forming an optoelectronic component in accordance with various embodiments; and FIGS. 6A-6E show schematic illustrations of electrical circuit structures in accordance with various embodiments.

DETAILED DESCRIPTION

Figure 2A:
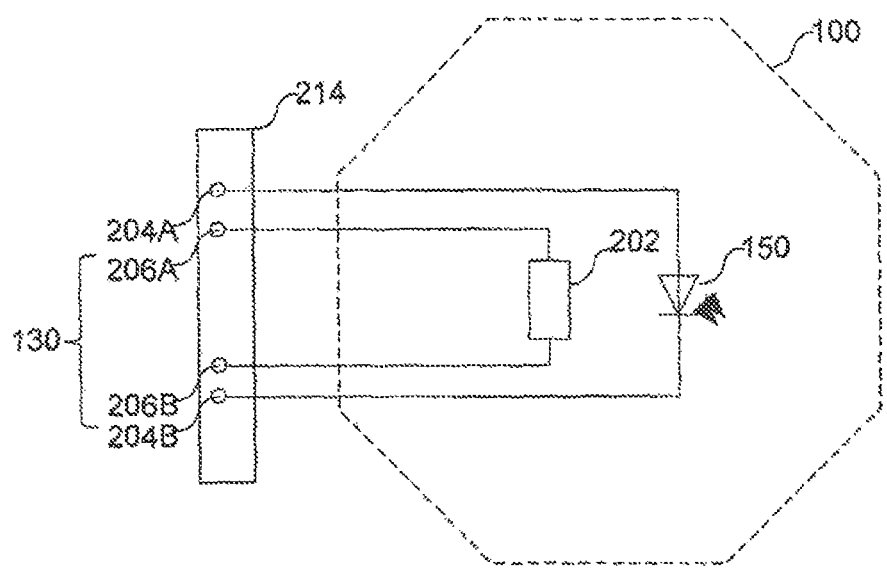
FIGS. 2A, 2B show schematic illustrations of one embodiment of an optoelectronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described, wherein an optoelectronic component includes an optically active region. The optically active region can absorb electromagnetic radiation and form a photocurrent therefrom or emit electromagnetic radiation by means of a voltage applied to the optically active region. In various embodiments, the electromagnetic radiation can have a wavelength range including x-ray radiation, UV radiation (A-C), visible light and/or infrared radiation (A-C).

A planar optoelectronic component including two planar, optically active sides can be formed for example as transparent or translucent in the connection direction of the optically active sides, for example as a transparent or translucent organic light emitting diode. A planar optoelectronic component can also be formed as a plane optoelectronic component, for example as a plane-parallel optoelectronic component.

However, the optically active region can also have a planar, optically active side and a planar, optically inactive side, for example an organic light emitting diode formed as a top emitter or a bottom emitter. The optically inactive side can be transparent or translucent, for example, or be provided with a mirror structure and/or an opaque substance or substance mixture, for example for heat distribution. The beam path of the optoelectronic component can be directed on one side, for example.

In the context of this description, providing electromagnetic radiation can be understood to mean emitting electromagnetic radiation. In other words, providing electromagnetic radiation can be understood as emitting electromagnetic radiation by means of a voltage applied to an optically active region.

In the context of this description, taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation.

In various configurations, an electromagnetic radiation emitting structure can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing.

In various embodiments, an optoelectronic component can be formed as an organic light emitting diode (OLED), an organic field effect transistor (OFET) and/or an organic electronic system. The organic field effect transistor can be a so-called "all-OFET", in which all the layers are organic. An optoelectronic component may include an organic functional layer system, which is synonymously also designated as organic functional layer structure. The organic functional layer structure may include or be formed from an organic substance or an organic substance mixture which is formed for example for providing an electromagnetic radiation from an electric current provided.

The optoelectronic component can be formed as an organic light emitting diode, an organic photodetector or an organic solar cell.

An organic light emitting diode can be formed as a top emitter or a bottom emitter. In the case of a bottom emitter, light is emitted from the optically active region through the carrier. In the case of a top emitter, light is emitted from the top side of the optically active region and not through the carrier.

A top emitter and/or bottom emitter can also be formed as optically transparent or optically translucent; by way of example, each of the layers or structures described below can be formed as transparent or translucent.

FIGS. 1A, 1B show schematic views of an optoelectronic component in accordance with various embodiments.

The optoelectronic component 100 includes an electrical circuit structure 130 and a planar optically active structure 150. The electrical circuit structure 130 and the planar optically active structure 150 can be monolithically integrated in the optoelectronic component 100, for example can be formed on or above a common carrier or substrate.

Configurations of the optically active structure 150 of the optoelectronic component 100 are described more comprehensively in FIG. 1B. Configurations of the electrical circuit structure 130 of the optoelectronic component 100 are described more comprehensively in FIGS. 2A-2B, 3A-3B, 4A-4B, 5 and 6A-6E.

FIG. 1B shows a schematic cross-sectional view of the optoelectronic component in accordance with various embodiments along the sectional plane A-A illustrated in FIG. 1A.

The optoelectronic component 100 includes a hermetically impermeable substrate, an active region 106 and an encapsulation structure.

The hermetically impermeable substrate may include a carrier 102 and a first barrier layer 104.

The active region 106 is an electrically active region 106 and/or an optically active region 106. The active region 106 is for example the region of the optoelectronic component 100 in which electric current for the operation of the optoelectronic component 100 flows and/or in which electromagnetic radiation is generated and/or absorbed.

The electrically active region 106 may include a first electrode 110, an organic functional layer structure 112 and a second electrode 114.

The organic functional layer structure 112 may include one, two or more functional layer structure units and one, two or more intermediate layer structure(s) between the layer structure units. The organic functional layer structure 112 may include for example a first organic functional layer structure unit 116, an intermediate layer structure 118 and a second organic functional layer structure unit 120.

The encapsulation structure may include a second barrier layer 108, a close connection layer 122 and a cover 124.

The carrier 102 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as opaque, translucent or even transparent.

The carrier 102 can be a part of a mirror structure or form the latter.

The carrier 102 can have a mechanically rigid region and/or a mechanically flexible region or be formed in this way, for example as a film.

The carrier 102 can be formed as a waveguide for electromagnetic radiation, for example can be transparent or translucent with respect to the emitted or absorbed electromagnetic radiation of the optoelectronic component 100.

The first barrier layer 104 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 104 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 104 including a plurality of partial layers, all the partial layers can be formed by means of an atomic layer deposition method. A layer sequence including only ALD layers can also be designated as a "nanolaminate".

In the case of a first barrier layer 104 including a plurality of partial layers, one or a plurality of partial layers of the first barrier layer 104 can be deposited by means of a different deposition method than an atomic layer deposition method, for example by means of a vapor deposition method.

The first barrier layer 104 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 104 may include one or a plurality of high refractive index materials, for example one or a plurality of materials having a high refractive index, for example having a refractive index of at least two.

Furthermore, it should be pointed out that, in various embodiments, a first barrier layer 104 can also be entirely dispensed with, for example for the case where the carrier 102 is formed in a hermetically impermeable fashion, for example includes or is formed from glass, metal, metal oxide.

The first electrode 104 can be formed as an anode or as a cathode.

The first electrode 110 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 110 composed of a metal or including a metal may include or be formed from one of the following materials: Ag, Pt, Au, Mg, Al, Ba, In, Ca, Sm or Li, and compounds, combinations or alloys of these materials. The first electrode 110 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 110 may include a layer or a layer stack of a plurality of layers of the same material or different materials. The first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 104 can have for example a layer thickness in a range of 10 nm to 500 nm, for example of less than 25 nm to 250 nm, for example of 50 nm to 100 nm.

The first electrode 110 can have a first electrical terminal, to which a first electrical potential can be applied. The first electrical potential can be provided by an energy source, for example a current source or a voltage source. Alternatively, the first electrical potential can be applied to an electrically conductive carrier 102 and the first electrode 110 can be electrically supplied indirectly through the carrier 102. The first electrical potential can be for example the ground potential or some other predefined reference potential.

FIG. 1B illustrates an optoelectronic component 100 including a first organic functional layer structure unit 116 and a second organic functional layer structure unit 120. In various embodiments, however, the organic functional layer structure 112 may furthermore include more than two organic functional layer structures, for example 3, 4, 5, 6, 7, 8, 9, 10, or even more, for example 15 or more, for example 70.

The first organic functional layer structure unit 116 and the optionally further organic functional layer structures can be formed identically or differently, for example include an identical or different emitter material. The second organic functional layer structure unit 120, or the further organic functional layer structure units can be formed like one of the below-described configurations of the first organic functional layer structure unit 116.

The first organic functional layer structure unit 116 may include a hole injection layer, a hole transport layer, an emitter layer, an electron transport layer and an electron injection layer.

In an organic functional layer structure unit 112, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 110. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino)-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and/or N,N,N',N'-tetra-naphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N'-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 116, 120 may include in each case one or a plurality of emitter layers, for example including fluorescent and/or phosphorescent emitters.

An emitter layer may include or be formed from organic polymers, organic oligomers, organic monomers, organic small, non-polymer molecules ("small molecules") or a combination of these materials.

The optoelectronic component 100 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]-ruthenium(III) complex) and blue fluorescent DPAVBi (4,4-bis[4-(di-p-tolylamino)styryl]biphenyl), green fluorescent TTPA (9,10-bis[N,N-di(p-tolyl) amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spin coating method.

The emitter materials can be embedded in a suitable manner in a matrix material, for example a technical ceramic or a polymer, for example an epoxy; or a silicone.

In various embodiments, the emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 116 may include one or a plurality of emitter layers embodied as hole transport layer.

Furthermore, the organic functional layer structure unit 116 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2''-(1,3,5-benzinetriyl)tris(1-phenyl-1-H-benzimidazole; 2-(4-biphenylyl)-5-(4-tert-butyl-phenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, Cs$_2$CO$_3$, Cs$_3$PO$_4$, Na, Ca, K, Mg, Cs, Li, LiF; 2,2',2''-(1,3,5-benzinetriyl)tris(1-phenyl-1-H-bensimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 112 including two or more organic functional layer structure units 116, 120, the second organic functional layer structure unit 120 can be formed above or alongside the first functional layer structure units 116. An intermediate layer structure 118 can be formed electrically between the organic functional layer structure units 116, 120.

In various embodiments, the intermediate layer structure 118 can be formed as an intermediate electrode 118, for example in accordance with one of the configurations of the first electrode 110. An intermediate electrode 118 can be electrically connected to an external voltage source. The external voltage source can provide a third electrical potential, for example, at the intermediate electrode 118. However, the intermediate electrode 118 can also have no external electrical connection, for example by the intermediate electrode having a floating electrical potential.

In various embodiments, the intermediate layer structure 118 can be formed as a charge generating layer structure 118 (charge generation layer CGL). A charge generating layer structure 118 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 118 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 118 can furthermore have a diffusion barrier between adjacent layers.

Each organic functional layer structure unit 116, 120 can have for example a layer thickness of a maximum of approximately 3 µm, for example a layer thickness of a maximum of approximately 1 µm, for example a layer thickness of a maximum of approximately 300 nm.

The optoelectronic component 100 may optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 100.

The second electrode 114 can be formed on or above the organic functional layer structure 112 or, if appropriate, on or above the one or the plurality of further organic functional layer structures and/or organic functional layers.

The second electrode 114 can be formed in accordance with one of the configurations of the first electrode 110, wherein the first electrode 110 and the second electrode 114 can be formed identically or differently. The second electrode 114 can be formed as an anode, that is to say as a hole-injecting electrode, or as a cathode, that is to say as an electron-injecting electrode.

The second electrode 114 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 108 can be formed on the second electrode 114.

The second barrier layer 108 can also be referred to as thin film encapsulation (TFE). The second barrier layer 108 can be formed in accordance with one of the configurations of the first barrier layer 104.

Furthermore, it should be pointed out that, in various embodiments, a second barrier layer 108 can also be entirely dispensed with. In such a configuration, the optoelectronic component 100 may include for example a further encapsulation structure, as a result of which a second barrier layer 108 can become optional, for example a cover 124, for example a cavity glass encapsulation or metallic encapsulation.

Furthermore, in various embodiments, in addition, one or a plurality of coupling-in/-out layers can also be formed in the optoelectronic component 100, for example an external coupling-out film on or above the carrier 102 (not illustrated) or an internal coupling-out layer (not illustrated) in the layer cross section of the optoelectronic component 100. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 108) can be provided in the optoelectronic component 100.

In various embodiments, a close connection layer 122, for example composed of an adhesive or a lacquer, can be provided on or above the second barrier layer 108. By means of the close connection layer 122, a cover 124 can be closely connected, for example adhesively bonded, on the second barrier layer 108.

A close connection layer 122 composed of a transparent material may include for example particles which scatter electromagnetic radiation, for example light-scattering particles. As a result, the close connection layer 122 can act as a scattering layer and lead to an improvement in the color angle distortion and the coupling-out efficiency.

The light-scattering particles provided can be dielectric scattering particles, for example, composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 122, for example air bubbles, acrylate, or hollow glass beads. Furthermore, by way of example, metallic nanoparticles, metals such as gold, silver, iron nanoparticles, or the like can be provided as light-scattering particles.

The close connection layer 122 can have a layer thickness of greater than 1 µm, for example a layer thickness of a plurality of µm. In various embodiments, the close connection layer 122 may include or be a lamination adhesive.

The close connection layer 122 can be designed in such a way that it includes an adhesive having a refractive index that is less than the refractive index of the cover 124. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 112, for example in a range of approximately 1.7 to approximately 2.0. Furthermore, a plurality of different adhesives can be provided which form an adhesive layer sequence.

In various embodiments, between the second electrode 114 and the close connection layer 122, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 122 can be optional, for example if the cover 124 is formed directly on the second barrier layer 108, for example a cover 124 composed of glass that is formed by means of plasma spraying.

Furthermore, a so-called getter layer or getter structure, for example a laterally structured getter layer, can be arranged (not illustrated) on or above the electrically active region 106.

The getter layer may include or be formed from a material that absorbs and binds substances that are harmful to the electrically active region 106. A getter layer may include or be formed from a zeolite derivative, for example. The getter layer can be formed as translucent, transparent or opaque and/or non-transmissive with respect to the electromagnetic radiation that is emitted and/or absorbed in the optically active region.

The getter layer can have a layer thickness of greater than approximately 1 µm, for example a layer thickness of a plurality of µm.

In various embodiments, the getter layer may include a lamination adhesive or be embedded in the close connection layer 122.

A cover 124 can be formed on or above the close connection layer 122. The cover 124 can be closely connected to the electrically active region 106 by means of the close connection layer 122 and can protect said region from harmful substances. The cover 124 can be for example a glass cover 124, a metal film cover 124 or a sealed plastics film cover 124. The glass cover 124 can be closely connected to the second barrier layer 108 or the electrically active region 106 for example by means of frit bonding (glass soldering/seal glass bonding) by means of a conventional glass solder in the geometric edge regions of the organic optoelectronic component 100.

The cover 124 and/or the close connection layer 122 can have a refractive index (for example at a wavelength of 633 nm) of 1.55.

Figure 2B:
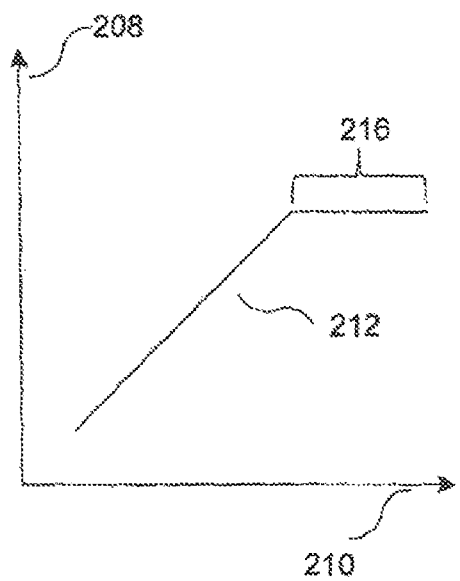

FIGS. 2A, 2B show schematic illustrations of one embodiment of an optoelectronic component.

An optoelectronic component device 200 may include an optoelectronic component 100, in accordance with one of the configurations from the description of FIGS. 1A and 1B, and an electronic ballast unit 124 (illustrated in FIG. 2A). The electrical circuit structure 130 and the planar optically active structure 150 can be monolithically integrated in the optoelectronic component 100. In FIG. 2A, the monolithic integration is illustrated by means of the dashed contour of the optoelectronic component from FIGS. 1A and 1B.

In one configuration, the electrical circuit structure 130 and the planar optically active structure 150 can have a common carrier 102.

In one configuration, the electrical circuit structure 130 can be adhesively bonded, for example laminated, on or above the carrier 102 and/or on, above or alongside the planar optically active structure 150.

The first electrode 110 and second electrode 114 of the optically active structure 150 as illustrated in FIG. 1B can be connected to a first terminal 204A and a second terminal 204B, respectively, of an electronic ballast unit 214, for example to a current output of the electronic ballast unit 214. Furthermore, the electrical circuit structure 130 is electrically connected to the electronic ballast unit 214 by means of the terminals 206A, 206B, for example to a signal input of the electronic ballast unit 214. The terminals 206A, 206B can be part of an interface or form such an interface.

In one configuration, the terminals 206A, 206B can be electrically connected to an electrical storage unit (not illustrated), wherein the output value of the electrical circuit structure 130 is stored in an electrically readable manner in the electrical storage unit.

In one configuration, the interface can be formed for wirelessly reading out the output value, for example may include an inductance component. The inductance component can be formed for example for radio frequency identification (RFID).

The electrical circuit structure 130 may include an electrical resistor 202. The resistance value of the electrical resistor 202 is a function of at least one electrical operating parameter of the optically active structure 150. By way of example, the resistance value 210 can be a function 212 of the operating current 208 of the optically active region (illustrated in FIG. 2B). The maximum operating current (illustrated as plateau 216 in FIG. 2B) can be limited by the design of the electronic ballast unit 214, for example because the latter cannot provide higher operating currents. The functional relationship 212 between the resistance value 210 and the operating current 208 to be applied can have a linear or nonlinear profile, for example an exponential, hyperbolic, geometrical and/or logarithmic profile; and/or have one or a plurality of discontinuities. The functional relationship 212 can be dependent on the substance configuration and/or structural configuration of the optically active structure 150. Furthermore, the functional relationship 212 can be dependent on the geometrical dimensioning of the optically active structure 150, for example the absolute value of the surface area of the optically active side of the optically active structure 150. The dependence of the output current, the output current density and/or the output voltage of the ballast unit on for example the measurable electrical resistance of the electrical circuit structure can be described by means of the functional relationship 212. An electrical circuit structure can have a resistance value 202 in the functional relationship 212. In other words: a point on the illustrated curve 212 is defined by means of the operating parameter of the optically active structure, for example the operating point of the organic light emitting diode.

The operating current 208 can be provided to the planar optically active structure 150 by means of the terminals 204A, 204B, wherein the operating current 208 of the planar optically active structure 150 flows through the planar optically active structure 150, wherein the electrical circuit structure 130 remains free of the operating current 208 provided to the optically active structure 150 for operating the optically active structure 150. In other words, during the operation of the planar optically active structure, the operating current 208 does not flow through the electrical circuit structure 130. This has the consequence, for example, that the planar optically active structure 150 can be operated independently of the electrical circuit structure 130. Furthermore, the output value can be read out before the planar optically active structure 150 is started up, and the operating current 208 or the operating voltage can be provided to the planar optically active structure 150 in accordance with the output value.

Figure 3A:
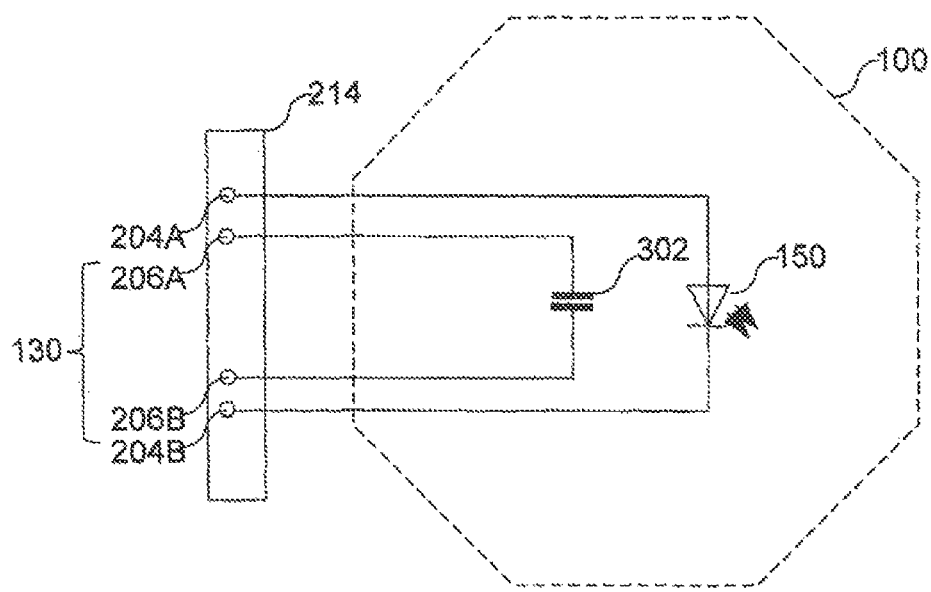
FIGS. 3A, 3B show schematic illustrations of one embodiment of an optoelectronic component.
Figure 3B:
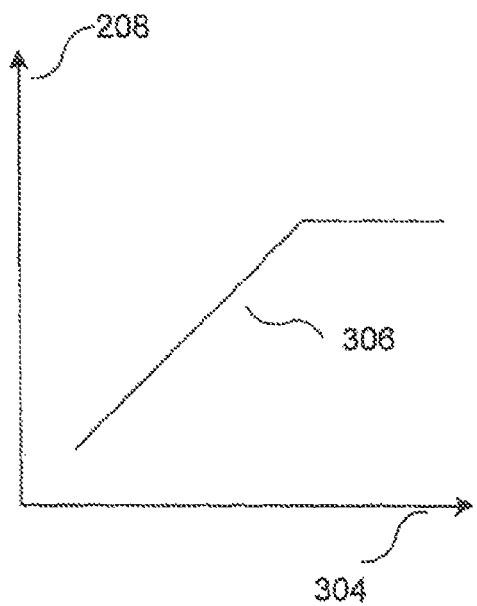

FIGS. 3A, 3B show schematic illustrations of one embodiment of an optoelectronic component.

Further to the configurations described above, the electrical circuit structure 130 of the optoelectronic component device 300 may include a capacitor 302 (illustrated in FIG. 3A) and/or an inductance (inductance component). An inductance can be a coil, for example. A coil can be a conductor track, for example, which is formed in a plane around a winding axis (not illustrated). A capacitor 302 includes a dielectric between two electrically conductive structures (also see FIGS. 6A-6E).

The output value of the electrical circuit structure 130 at the terminals 206A, 206B of the electronic ballast unit 214 can be a function of the capacitance of the capacitor and/or a function of the inductance of the inductance component.

FIG. 3B illustrates, analogously to FIG. 2B, the functional relationship 306 between the operating current 208 provided by the electronic ballast unit 214 and the capacitance 304 of the capacitor. The functional relationship 306 can be formed in accordance with one of the configurations from the description of FIG. 2B.

In various embodiments, an electrical circuit structure may include a plurality of the electrical components described above, for example one electrical resistor, a plurality of electrical resistors and/or one or a plurality of capacitor(s). The plurality of electrical components may include a plurality of electrical components electrically connected in series and/or serially for the purpose of setting the output value to the terminals 206A, 206B. The current output by the electronic ballast unit and/or the voltage output are/is dependent on the output value of the electrical circuit structure. The electrical circuit structure is formed in such a way that the electronic ballast unit receives communication of what current and/or what voltage are/is intended to be provided to the optically active structure. The specific configuration of the electrical circuit structure can be dependent on the configuration of the electronic ballast unit of the optoelectronic component, for example whether the electronic ballast unit can read out a bit pattern. Furthermore, the specific configuration can be dependent on how the operating current of the optically active structure 150 is functionally dependent on the output value of the electronic ballast unit, for example in order to provide different functional relationships for different electronic ballast units. This functional dependence can be formed for example by means of the configuration of an electrical circuit in the electronic ballast unit.

Figures 4A, 4B:
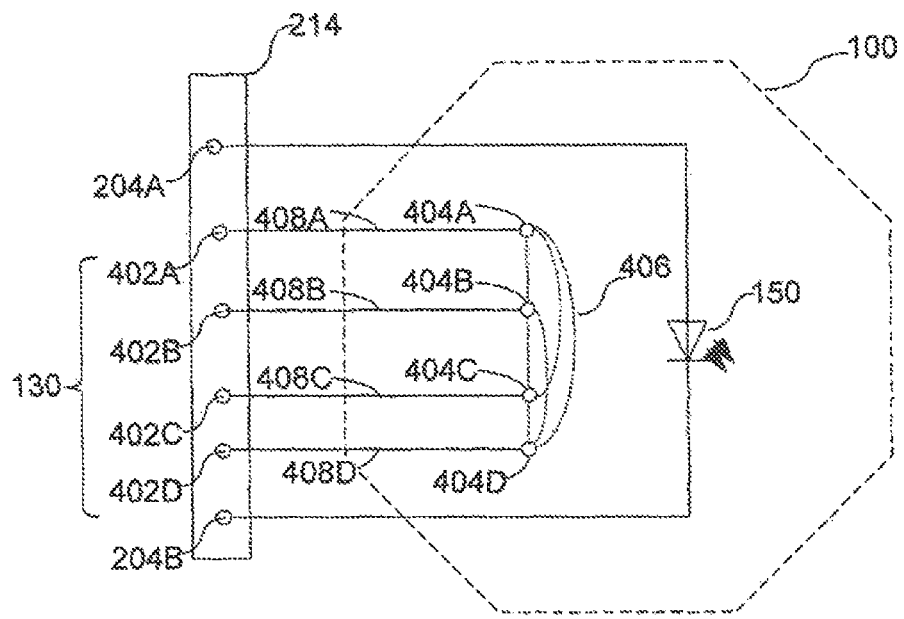
FIGS. 4A, 4B show schematic illustrations of one embodiment of an optoelectronic component.

FIGS. 4A, 4B show schematic illustrations of one embodiment of an optoelectronic component.

Further to the configurations described above, the electrical circuit structure 130 of the optoelectronic component device 400 may include an electrical conductor structure (illustrated in FIG. 4A).

The electronic ballast unit 214 may include a plurality of terminals (illustrated as terminals 402A, 402B, 402C, 402D in FIG. 4A) for reading out the output value of the electrical circuit structure 130 with a line structure. The plurality of terminals can be provided as separate inputs in the electronic ballast unit.

Furthermore, the different terminals can be formed as contacts for different lines of a cable, wherein the electronic ballast unit includes a cable input for reading from the different lines, for example a pin socket.

Furthermore, the conductor structure can be formed in such a way that the output value is a function of the electrically conductive lines 408A-D, i.e. can be dependent on the bit pattern 410 of the different lines 408A-D. Depending on the bit pattern 410 of the electrical lines 408 (illustrated by means of the terminals 404A-D and bridging possibilities 406 in FIG. 4A), the electronic ballast unit 214 can provide different electrical operating parameters at the terminals 204A, 204B of the optically active structure 150.

FIG. 4B illustrates one embodiment of a functional relationship (analogously to the description of FIG. 2B and FIG. 3B) of the operating current of the optically active structure 150 for different bit patterns 410 of the conductor structure. The bit pattern is formed by means of a bridging 406 and/or interruption 610 (see FIGS. 6A-6E) of electrical lines 408A-D. By way of example, in the case of a bridging of a first terminal 402A with the second terminal 402B, the electronic ballast unit 214 receives the information or request to provide an operating current of 100 mA to the terminals 204A, 204B of the optically active structure 150 (highlighted by means of the border 412 in FIG. 4B). The bridging can be formed in the example by the lines 408A, 408B of the conductor structure in the region of the terminals 404A, 404B of the electrical circuit structure in/on the optoelectronic component being electrically connected to one another or an existing electrical connection being electrically interrupted (also see the description of FIGS. 6A-6E).

By means of further bridgings 406 (illustrated schematically in FIG. 4A), further operating parameters of the optically active structure 150 can be communicated to the electronic ballast unit. Said parameters can thereupon be provided at the terminals 204A, 204B of the optically active structure 150 by the electronic ballast unit 214. Further operating parameters may include for example larger or smaller operating currents; different operating voltages 414 and/or different AC frequencies 416.

The entries of the bit pattern matrix illustrated in FIG. 4B are signals which are processed further by the electronic ballast unit 214 as information, arrangements and/or requests.

In the case of an optoelectronic component 100 and/or an optically active structure 150 including a plurality of light emitting units which are electrically energizable independently of one another, at least one output value of the electrical circuit structure can signal to the electronic ballast unit 214, for example, what duty ratio, what pulse widths, what pulse amplitudes and/or what pulse frequencies the current at the terminals 206 of the optically active structure 150 is intended to have.

A first light emitting unit is energizable independently of a second light emitting unit if the optoelectronic component is formed and electrically drivable in such a way that only the first light emitting unit emits a first electromagnetic radiation in a first operating mode and only the second light emitting unit emits a second electromagnetic radiation in a second operating mode. As a result, it is possible to set for example the color locus of the within a sampling time of the electromagnetic radiation emitted in the first operating mode and in the second operating mode.

Furthermore, the bit pattern can be combined with above-described configurations of the electrical circuit structure, and vice versa. By way of example, an electrical resistance can be formed in the case of at least one portion of the plurality of electrical lines of the conductor structure. Alongside the bit pattern, the voltage drop across the respective lines can thereby be used for communicating a further information item or request to the electronic ballast unit. In addition to or instead of the electrical resistance, one line or a plurality of lines of the conductor structure may include a capacitance and/or inductance or be formed in this way. In other words: by means of a conductor structure, alongside the bit pattern via further channels, for example a measurement of the voltage drop across a line, it is possible to provide further information items from the electrical circuit structure for the electronic ballast unit.

FIG. 5 shows a schematic illustration containing a method for forming an optoelectronic component in accordance with various embodiments.

In various embodiments, the method 500 for producing an optoelectronic component includes forming 502 an optically active structure. The planar optically active structure can be formed in accordance with one of the configurations from the description of FIGS. 1A-1B, 2A-2B, 3A-3B and 4A-4B.

Furthermore, the method 500 may include determining 504 at least one operating parameter of the optically active structure of the optically structure of the optoelectronic component. However, two or more operating parameters can also be determined simultaneously or successively.

An operating parameter may include one of the following variables with regard to the operation of the optically active structure: the current intensity of the operating current; the operating voltage, the frequency of the operating current in the case of an alternating operating current of the optically active structure; the electrical resistance of the optically active structure; a maximum permissible current intensity or voltage; the original color locus and/or the original intensity of the emittable or absorbable electromagnetic radiation; a maximum permissible temperature; a maximum operating duration; a coefficient used to define an increase or decrease in the operating current or other parameters mentioned over the lifetime. Optoelectronic components, for example organic light emitting diodes, become darker as the operating duration increases. This decrease in the intensity can be compensated for with additional current. By way of example, the electronic ballast unit can be formed in such a way that the electronic ballast unit—after it has been communicated the information regarding for how long the organic light emitting diode has already been operated—by means of the communicated coefficient can calculate what current is to be set after x hours of operation.

Determining 504 at least one operating parameter may include measuring a voltage drop, an impedance, a capacitance, a current, of the optically active structure. Furthermore, determining 504 may include determining the color locus and/or the intensity of the electromagnetic radiation emittable and/or absorbable in/by the optically active structure.

The original color locus and/or the original intensity of the emittable or absorbable electromagnetic radiation can be used by the electronic ballast unit in order to compensate for an aging-dictated reduction in the intensity and/or an aging-dictated shift in the color locus of the emittable and/or absorbable electromagnetic radiation. As a result, the emitted and/or absorbed electromagnetic radiation can have a constant color locus and/or a constant intensity during the lifetime of the optoelectronic component.

Determining 504 the operating parameter, forming 506 the electrical circuit structure, reading out the output value in the electronic ballast unit and/or adapting the operating parameter of the current at the terminals of the optically active structures can be implemented singly or multiply. The single implementation of methods mentioned above can be effected before and/or during the connection of the optically active structure to the electronic ballast unit. In a departure therefrom, the repeated implementation may include at least one of the methods mentioned during the operation of the optoelectronic component, for example repeatedly. By way of example, as a result aging-dictated changes in optical and/or electrical properties of the optically active structure can be compensated for by means of altering at least one operating parameter.

Furthermore, the method may include forming 506 an electrical circuit structure taking account of the determined operating parameter. The electrical circuit structure is formed in such a way that the output value of the electrical circuit structure is a function of the determined operating parameter. The output value of the electrical circuit structure may include or be an electrical resistance value, a capacitance, an inductance and/or a bit pattern, as described above.

In various embodiments, forming 502 the optically active structure may include forming an electrical circuit preliminary structure. Forming the circuit preliminary structure may include for example forming a metallization layer and/or forming one or a plurality of electrical lines and/or one or a plurality of electrical structures. The circuit preliminary structure can be formed on and/or alongside the optically active structure, for example on or above an optically inactive region or an optically inactive side of an optically active region. By way of example, the circuit preliminary structure can be formed on the cover of the optically active structure and/or on a contact strip of the optically active structure. In one configuration, a cover is formed on or above the electrical circuit structure in such a way that a contact region of the electrical circuit structure is exposed.

The electrical circuit preliminary structure and/or the electrical circuit structure can be formed in a manner electrically insulated from the optically active structure.

Forming 506 the electrical circuit structure may include structuring the electrical circuit preliminary structure.

The electrical circuit preliminary structure can become the electrical circuit structure by means of the structuring. The structuring may include applying or removing a substance or substance mixture from the electrical circuit preliminary structure.

Forming 506 the electrical circuit structure 130 may include for example forming an electrically insulating structure and/or forming an electrical bridging structure in the electrical circuit preliminary structure.

However, structuring may furthermore include converting a part of the electrical circuit preliminary structure, for example doping. As a result, the electrical conductivity and/or magnetizability of the doped part of the electrical circuit preliminary structure can be altered. As a result, by way of example, the current path in the electrical circuit structure can be formed in accordance with a predefined current path.

Furthermore, forming the electrically insulating structure and/or forming the electrical bridging structure can be implemented in such a way that the capacitance of a capacitor; the resistance value of an electrical resistor; the inductance of an inductance component; and/or the bit pattern of a conductor structure are formed with regard to a determined operating parameter.

Furthermore, forming the electrically insulating structure may include ballistic exposure, for example laser ablation.

Ballistic exposure of the regions to be exposed can be realized for example by means of bombardment of the region to be exposed with particles, molecules, atoms, ions, electrons and/or photons.

Bombardment with photons can be formed for example as laser ablation with a wavelength in a range of approximately 200 nm to approximately 1700 nm, for example can be formed in a focused manner, for example with a focus diameter in a range of approximately 10 µm to approximately 2000 μm, for example in a pulsed manner, for example with a pulse duration in a range of approximately 100 fs to approximately 0.5 ms, for example with a power of approximately 50 mW to approximately 1000 mW, for example with a power density of approximately 100 kW/cm$^2$ to approximately 10 GW/cm$^2$, and for example with a repetition rate in a range of approximately 100 Hz to approximately 1000 Hz.

By way of example, a part of an electrically conductive substance can thereby be removed from the electrical circuit preliminary structure.

As a result, by way of example, an electrically insulating substance can be exposed. As a result, by way of example, the current path can be diverted. Furthermore, as a result, by way of example, the electrical resistance can be formed, for example by the current path being constricted. Furthermore, the capacitance of a capacitor can be formed as a result.

The electrical circuit preliminary structure can be formed with a first electrically conductive structure 612A and at least one second electrically conductive structure 612B, wherein the first electrically conductive structure 612A is formed in a manner electrically insulated from the second electrically conductive structure 612B. Furthermore, the first electrically conductive structure 612A can be electrically connected to the second electrically conductive structure 612B by means of an electrical component.

Further configurations for forming an electrical circuit structure are illustrated in FIGS. 6A-6E and associated description.

FIGS. 6A-6E show schematic illustrations of electrical circuit structures in accordance with various embodiments.

In a departure from or in addition to configurations described above, configurations of electrical circuit structures are described and illustrated in FIGS. 6A-6E.

Figure 6A:
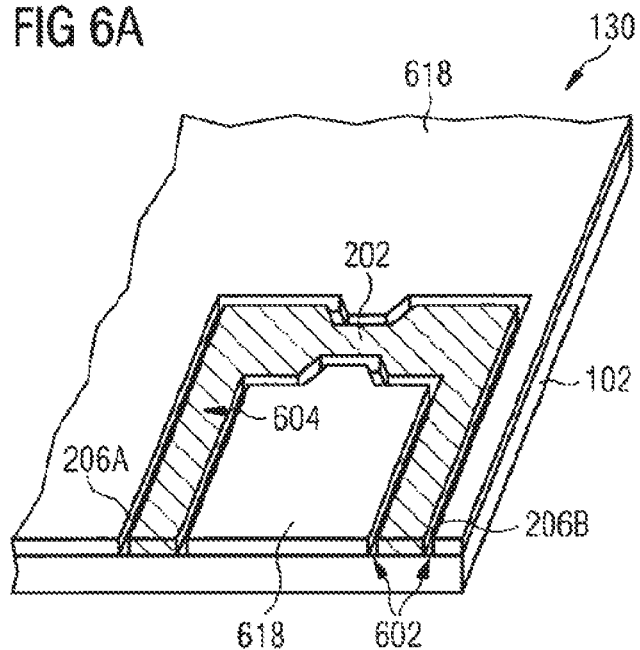
Figure 6B:
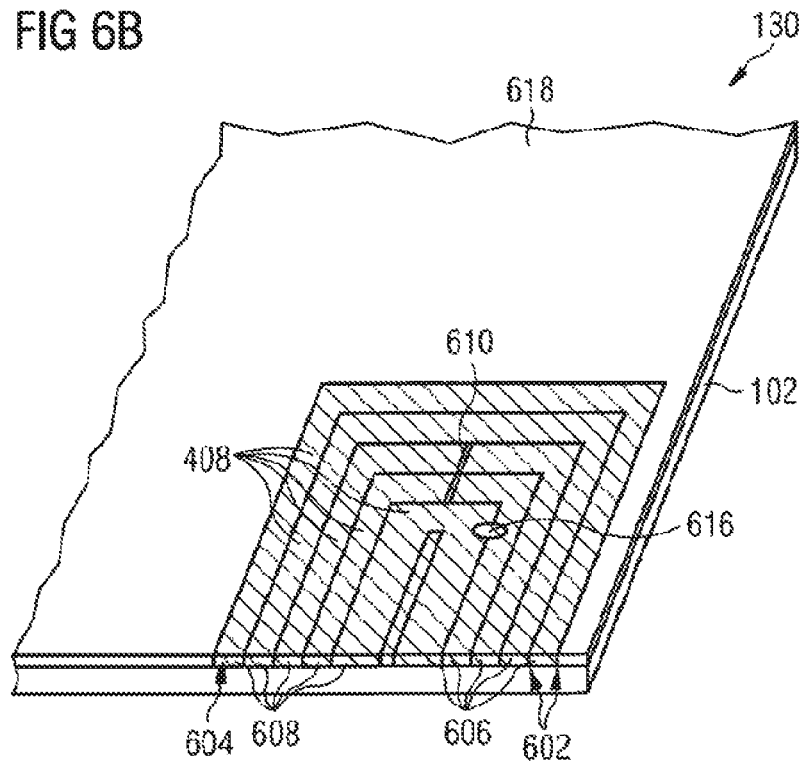

The electrical circuit structure 130 can be formed by a part of a metallization layer being removed (illustrated in FIG. 6A and FIG. 6B), for example by means of laser ablation (see description of FIG. 5). In FIG. 6A and FIG. 6B, the removed part of a metallization layer is identified by the arrows bearing the reference signs 602. The region (identified by the arrow bearing the reference sign 604) electrically separated from the metallization plane by means of the removed part 602 can form an electrical circuit structure or electrical circuit preliminary structure.

The electrically separated region 604, for example an electrical line, can have for example a width in a range of approximately 500 μm to approximately 5 mm, for example in a range of approximately 1 mm to approximately 2 mm.

The electrical terminals 206A, 206B can be electrically connected to a flexible printed circuit board (FlexPCB) with the electronic ballast unit for example by means of an adhesive-bonding connection using electrically conductive adhesive (anisotropic conductive film bonding—ACF bonding).

An electrical resistor 202 can be formed, in accordance with the description above and below. By way of example, the electrically separated region can have a taper in the current path, such that the electrical resistance of the electrical circuit structure 130 and thus the voltage drop across the electrical circuit structure 130 are increased.

FIG. 6A illustrates an electrical resistor 202 composed of a thin metal, wherein the metallization 604 is electrically insulated from the surrounding metallization 618 by means of laser ablation lines 602. The electrical resistance from the first terminal 206A to the second terminal 206B identifies the optoelectronic component for the electronic ballast unit. The latter can thereupon automatically set the electrical current supply with regard to the optically active structure and provide a correct current for electrically connecting and operating the optoelectronic component. Each optoelectronic component may include for example an electrical circuit structure having a component-specific electrical resistor.

Furthermore, a conductor structure having a plurality of electrical lines 408 can be formed by means of removing a metallization layer (illustrated in FIG. 6B). A line may include a first terminal 606 and a second terminal 608. The electrical lines 408 are electrically insulated from one another. By means of an electrical voltage being applied across the first terminal 606 and the second terminal 608, an electrical current can flow through the electrical lines 408.

The electrical connection from the first terminal 606 to the second terminal 608 can be electrically interrupted by means of removing a part of a line 408 (illustrated by means of the reference sign 610 in FIG. 6B). Furthermore, lines 408 that are electrically insulated from one another can be electrically connected to one another by means of forming an electrical bridging 616. As a result, a bit pattern (see the description of FIG. 4B) can be formed as an output value of the electrical circuit structure 130. In one configuration, the lines 408 of the conductor structure can have a common first terminal 606. The process of forming the bit pattern can be simplified as a result.

An interruption of an electrical line can be formed by a part of the electrical line being removed in the current path, such that no current flow can take place. However, an interruption can also be formed by an electrically insulating substance being formed between two contacts, instead of an electrically conductive substance.

An electrical circuit preliminary structure may include a first electrically conductive structure 612A and a second electrically conductive structure 612B. The first electrically conductive structure 612A and the second electrically conductive structure 612B can be formed as or include electrical terminals (206A, 206B) of the electrical circuit structure 130 (illustrated in FIG. 6C and FIG. 6D). Further electrically conductive and/or electrically insulating structures can be formed electrically between the first electrically conductive structure 612A and the second electrically conductive structure 612B.

Forming the electrical circuit structure 130 may include forming an electrical circuit preliminary structure 620.

Forming a metallization layer from and/or on which the electrical components of the electrical circuit structure are formed can be effected with the process of forming the optically active structure, for example in parallel therewith.

The latter can be formed, for example, by a part 610 of a metallization layer being removed. Removing the part 610 of the metallization layer can be a step in the process of forming the electrical circuit preliminary structure and/or in the process of forming the electrical circuit structure.

For example, removing the part 610 of the metallization layer during the process of forming the electrical circuit preliminary structure 620 a general circuit structure 130 can be formed which are/is suitable for a multiplicity of optoelectronic components and/or optically active structures. After at least one operating parameter of the optically active structure has been determined, the output value of the electrical circuit structure can be set finely, for example by the size of an electrical resistance, of a capacitor, of an inductance and/or the bit pattern being set.

By way of example, in the case of a capacitor 302, the capacitance of the capacitor can be finely set by means of an electrically insulating interruption 614 of at least one of the conductive structures (illustrated in FIG. 6C).

By way of example, a third electrically conductive structure 612C and a fourth electrically conductive structure 612D can be formed electrically between the first electrically conductive structure 612A and the second electrically conductive structure 612B. The plurality of electrically conductive structures 612 that are electrically insulated from one another in the electrical circuit structure can be electrically connected to one another by means of a bridging structure. As a result, different electrical resistors, capacitors, conductor structures and/or inductances can be formed in a flexible manner (illustrated in FIG. 6D).

Forming the bridging structure 616 may include forming an electrical connection between the first electrically conductive structure 612A and the second electrically conductive structure 612B. However, at least one electrical component described above can be formed electrically between the first electrically conductive structure 612A and the second electrically conductive structure 612B. The bridging structure 616 can be formed for example in such a way that the output value of the electrical circuit structure is set by means of the bridging structure.

Forming the electrically conductive connection may include applying an electrically conductive substance between the first electrically conductive structure 612A and the second electrically conductive structure 612B in such a way that an electrical connection is formed between the first electrically conductive structure 612A and the second electrically conductive structure 612B (illustrated in FIG. 6D).

Forming the electrical circuit structure may include forming an electrically insulating structure 610 between the first electrically conductive structure 612A and the second electrically conductive structure 612B. Forming an electrically insulating structure 610, 614 may include for example applying an electrically insulating substance, exposing an electrically insulating substance (illustrated in FIGS. 6B-6E) and/or converting an electrically conductive substance into an electrically conductive substance, for example doping, oxidizing, nitriding.

Forming the electrically insulating structure 610, 614 may include removing a part 614, 610 of the third electrically conductive structure in such a way that a fourth electrically conductive structure and a fifth electrically conductive structure are formed. By way of example, the third electrically conductive structure can be formed in a manner electrically separated into two regions that are electrically insulated from one another. In other words: the fourth electrically conductive structure can be electrically insulated from the fifth electrically conductive structure.

By means of removing the part 614, 610 of the third electrically conductive structure, the current path through the electrical circuit structure 130 can be altered (illustrated in FIG. 6E), as a result of which the output value of the electrical circuit structure can be set.

In various embodiments, an optoelectronic component, an optoelectronic component device and a method for producing an optoelectronic component are provided which make it possible to form and operate an organic optoelectronic component that is technically simpler to operate. As a result, the user of organic optoelectronic components is spared a number of searches, calculations, technical decisions and purchases. By means of simple connection of the electrical circuit structure, for example of coding pins of the electrical circuit structure, to a terminal of the electronic ballast unit, the user can correctly set or configure the system including optoelectronic component and electronic ballast unit. Furthermore, it is possible to reduce incorrect settings with regard to the maximum current intensity, as a result of which complaint queries, for example as in the case of increased aging of the OLED or in the case of relatively early failure of the OLED owing to overenergization, are reduced. In various configurations, the electronic circuit structure can be formed cost-effectively, for example without complex and cost-intensive photolithographic methods being implemented. Furthermore, the optoelectronic component can be formed in a self-identifying manner with regard to the electronic ballast unit. As a result, there is no need for further method steps when connecting the optoelectronic component to the electronic ballast unit, for example no need for conventional connection clamping of an electrical resistor to two terminals on the electronic ballast unit.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a planar optically active structure and an electrical circuit structure,
wherein the planar optically active structure is formed for taking up and/or providing electromagnetic radiation;
wherein the electrical circuit structure is formed in such a way that it provides an output value, wherein the output value is dependent on at least one operating parameter of the planar optically active structure; and
wherein the optoelectronic component comprises a first terminal and a second terminal for providing an operating current to the planar optically active structure; wherein the planar optically active structure and the electrical circuit structure are electrically isolated from each other; and wherein the electrical circuit structure is formed with one or a plurality of the following electrical structures:
an electrical resistor, wherein the output value is dependent on the electrical resistance value of the electrical resistor;
a capacitor, wherein the output value is dependent on the capacitance of the capacitor;
an inductance component, wherein the output value is dependent on the inductance of the inductance component; and/or
a conductor structure having a plurality of electrical lines in such a way that the output value is dependent on the bit pattern of the plurality of electrical lines.

2. The optoelectronic component as claimed in claim 1, wherein the planar optically active structure comprises a first electrode, a second electrode and an organic functional layer structure, wherein the organic functional layer structure is formed between the first electrode and the second electrode.

3. The optoelectronic component as claimed in claim 1, wherein the optoelectronic component is formed as an organic light emitting diode, an organic solar cell and/or an organic photodetector.

4. The optoelectronic component as claimed in claim 1, wherein the optoelectronic component is formed as a surface component.

5. A method for producing an optoelectronic component, the method comprising:
- forming a planar optically active structure, wherein the planar optically active structure is formed for taking up or providing electromagnetic radiation;
- determining at least one operating parameter of the planar optically active structure of the optoelectronic component by measuring a characteristic of the planar optically active structure; and
- forming an electrical circuit structure taking account of the determined operating parameter in such a way that an output value of the electrical circuit structure is a function of the determined operating parameter,
- wherein the planar optically active structure and the electrical circuit structure are electrically isolated from each other and
- wherein the electrical circuit structure is formed with one or a plurality of the following electrical structures;
- an electrical resistor, wherein the output value is dependent on the electrical resistance value of the electrical resistor;
- a capacitor, wherein the output value is dependent on the capacitance of the capacitor;
- an inductance component, wherein the output value is dependent on the inductance of the inductance component; and/or a conductor structure having a plurality of electrical lines in such a way that the output value is dependent on the bit pattern of the plurality of electrical lines.

6. The method as claimed in claim 5,
wherein forming the planar optically active structure comprises forming an electrical circuit preliminary structure.

7. The method as claimed in claim 5,
wherein forming the electrical circuit structure comprises structuring the electrical circuit preliminary structure.

8. The method as claimed in claim 7,
wherein forming the electrical circuit structure comprises forming an electrically insulating structure and/or forming an electrical bridging structure in the electrical circuit preliminary structure.

9. The method as claimed in claim 8,
wherein forming the electrically insulating structure comprises a laser ablation.

10. The method as claimed in claim 8,
wherein forming the electrical circuit preliminary structure comprises forming an electrically conductive structure, wherein forming the electrically insulating structure comprises removing a part of an electrically conductive structure in such a way that a first electrically conductive structure and a second electrically conductive structure are formed.

11. The method as claimed in claim 10,
wherein the current path through the electrical circuit structure is altered by means of removing the part of the electrically conductive structure.

12. The method as claimed in claim 5,
wherein forming the planar optically active structure comprises forming a first electrode;
- forming an organic functional layer structure on the first electrode; and
- forming a second electrode on the organic functional layer structure.

13. The method as claimed in claim 5,
wherein the optoelectronic component is formed as an organic light emitting diode, an organic solar cell and/or an organic photodetector.

14. An optoelectronic component device, comprising:
an optoelectronic component;
a planar optically active structure and an electrical circuit structure,
wherein the planar optically active structure is formed for taking up and/or providing electromagnetic radiation;
wherein the electrical circuit structure is formed in such a way that it provides an output value, wherein the output value is dependent on at least one operating parameter of the planar optically active structure; and
wherein the optoelectronic component comprises a first terminal and a second terminal for providing an operating current to the planar optically active structure;
wherein the operating current of the planar optically active structure flows through the planar optically active structure, wherein the electrical circuit structure remains free of the operating current provided to the planar optically active structure for operating the planar optically active structure,
an electronic ballast unit, which is designed for providing an electrical current to the planar optically active structure and/or for taking up an electrical current from the optically active structure;
wherein the electronic ballast unit comprises a first terminal, a second terminal and a determining device, wherein the determining device is electrically coupled to the first terminal and the second terminal;
wherein the planar optically active structure is electrically connected to the first terminal, and the electrical circuit structure is electrically connected to the second terminal;
wherein the determining device is configured to determine the output value of the electrical circuit structure and, by means of the determined output value, alter at least one operating parameter of the planar optically active structure with regard to a predefined operating parameter; and wherein the electrical circuit structure is formed with one or a plurality of the following electrical structures:
an electrical resistor, wherein the output value is dependent on the electrical resistance value of the electrical resistor;
a capacitor, wherein the output value is dependent on the capacitance of the capacitor;
an inductance component, wherein the output value is dependent on the inductance of the inductance component; and/or a conductor structure having a plurality of electrical lines in such a way that the output value is dependent on the bit pattern of the plurality of electrical lines.

15. The method as claimed in claim 5,
wherein the optoelectronic component is formed having a first terminal and a second terminal for providing the operating current to the planar optically active structure.

* * * * *